United States Patent
Kuwahara (10) Patent No.: US 7,345,496 B2
(45) Date of Patent: Mar. 18, 2008

(54) SEMICONDUCTOR APPARATUS AND TEST EXECUTION METHOD FOR SEMICONDUCTOR APPARATUS

(75) Inventor: Takeshi Kuwahara, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/798,413

(22) Filed: May 14, 2007

(65) Prior Publication Data

US 2007/0262785 A1    Nov. 15, 2007

(30) Foreign Application Priority Data

May 15, 2006    (JP)    ............................. 2006-135784

(51) Int. Cl.
     *G01R 31/02*    (2006.01)

(52) U.S. Cl. .................................................. 324/763
(58) Field of Classification Search ................ 324/763, 324/765

See application file for complete search history.

(56) References Cited

FOREIGN PATENT DOCUMENTS

JP    2000-304831    11/2000

*Primary Examiner*—Evan Pert
(74) *Attorney, Agent, or Firm*—McGinn IP Law Group, PLLC (57) ABSTRACT

A semiconductor apparatus includes a reset terminal to input a reset control signal to reset an internal circuit, a reset detector to generate a reset clear signal to clear a reset of the internal circuit according to the input reset control signal and a mode capture unit to retain a test mode to test an operation of the internal circuit according to a signal input to the reset terminal.

8 Claims, 6 Drawing Sheets

RELATED ART

Fig. 6

SEMICONDUCTOR APPARATUS AND TEST EXECUTION METHOD FOR SEMICONDUCTOR APPARATUS

BACKGROUND OF THE INVENTION

1. Field of the Invention

The present invention relates to a semiconductor apparatus, and particularly to a semiconductor apparatus capable of setting a test mode to an internal circuit from outside and a test execution method therefor.

2. Description of Related Art

A semiconductor apparatus has a test mode in order to test an internal circuit. In recent years, along with the increasing functions and higher integration of a semiconductor apparatus, kind of the test mode is also increasing. In the test mode, a mode setting signal is input for setting to the test mode from outside the semiconductor apparatus. Selection of the test mode is carried out according to the mode setting signal. The mode setting signal is usually a multibit digital signal.

Figure 6:
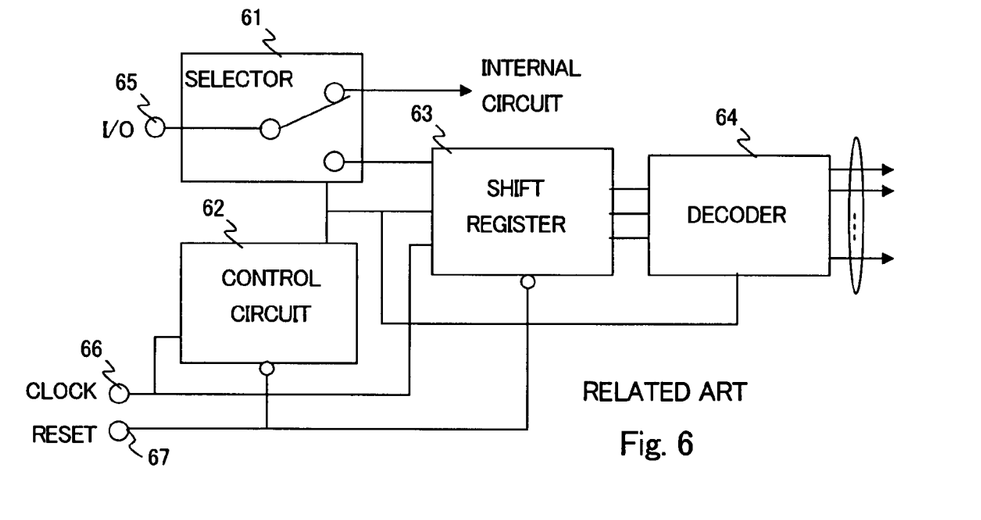
FIG. 6 is a configuration diagram showing the configuration of a conventional semiconductor apparatus.

Japanese Unexamined Patent Application Publication No. 2000-304831 discloses a semiconductor apparatus that is set to the test mode. The semiconductor apparatus disclosed in Japanese Unexamined Patent Application Publication No. 2000-304831 is shown in FIG. 6. A reset signal is input to the semiconductor apparatus from a reset terminal 67, and a clock signal is input to the semiconductor apparatus from a clock terminal 66. A control circuit 62 and shift register 63 are reset by the reset signal. In the test mode, a selector 61 connects an I/O terminal 65 with the shift register 63. Then a test mode control signal is input from the I/O terminal 65. A test mode control signal is latched by the shift register 63. The latched test mode control signal is decoded to a mode setting signal by a decoder 64. In the semiconductor apparatus, clocks corresponding to the time required to reset and clocks corresponding to the time required to set to test mode are determined in advance. The semiconductor apparatus switches the selector 61 when clocks input to the control circuit 62 reaches to the predetermined number of clocks. By doing this, the I/O terminal 65 is connected to the internal circuit.

As the semiconductor apparatus of FIG. 6 uses test terminals and I/O terminals corresponding to bits of the test mode setting signal, increasing test modes to set causes to increase external terminals. Further, as a signal for setting to test mode is input from the I/O terminal, the selector is connected to the I/O terminal. Since the selector is connected to the I/O terminal, an AC characteristic of an input/output signal at a normal operation mode may be deteriorated or delayed. As described in the foregoing, it has now been discovered that in the semiconductor apparatus, the number of terminals for setting to the test mode may increase. Further an influence may be generated to an input/output terminal at a normal time.

SUMMARY

In one embodiment of the present invention, there is provided a semiconductor apparatus that includes a reset terminal to input a reset control signal to reset an internal circuit, a reset detector to generate a reset clear signal to clear a reset of the internal circuit according to the input reset control signal and a mode capture unit to retain a test mode to test an operation of the internal circuit according to a signal input to the reset terminal.

In another embodiment of the present invention, there is provided a method to execute a test in a semiconductor apparatus to execute a test corresponding to a test mode specified, the method includes resetting an internal circuit of a semiconductor apparatus by a reset signal input to the reset terminal, changing the signal input to the reset terminal to set the test mode and executing a test corresponding to the test mode set by the setting according to the reset clear signal input to the reset terminal.

The present invention provides a semiconductor apparatus capable of inputting a test mode setting signal even with a small number of terminals thereby preventing from generating an influence to an input/output signal at a normal time.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
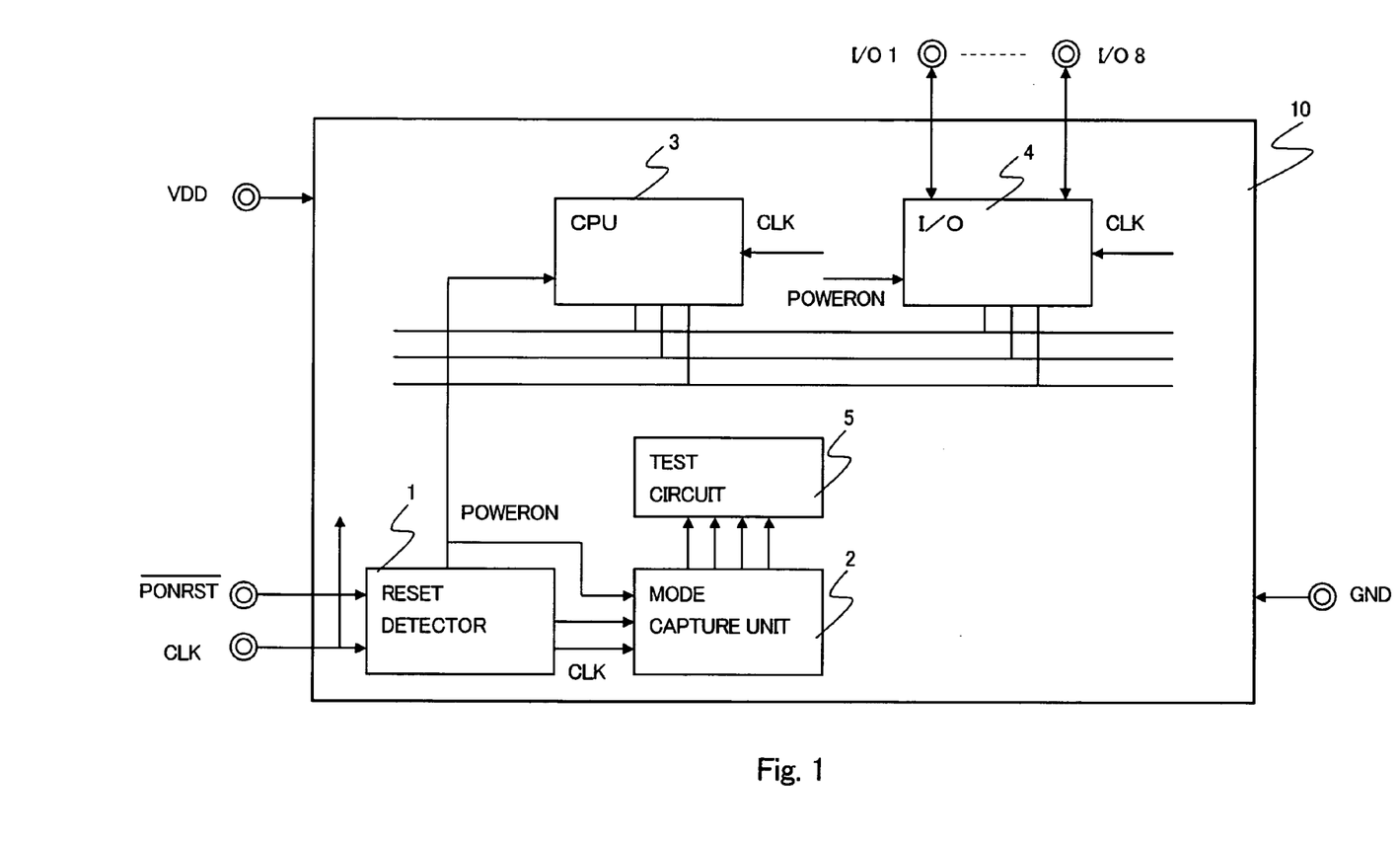
FIG. 1 is a configuration diagram showing the configuration of a semiconductor apparatus according to a first embodiment of the present invention.

A first embodiment of the present invention is described hereinafter in detail with reference to the drawings. FIG. 1 is a block diagram showing a semiconductor apparatus according to the first embodiment.

A semiconductor apparatus 100 of this embodiment includes a reset detector 1, mode capture unit 2, CPU 3, I/O buffer 4, and test circuit 5. To the semiconductor apparatus 100 of this embodiment, a power supply potential is supplied from a power supply terminal VDD and a ground potential is supplied from a ground terminal GND. Further, to this semiconductor apparatus, a signal for controlling to reset is supplied from a power on reset terminal PONRST, which is a reset control terminal, and a clock signal is supplied from a clock terminal CLK.

The reset detector 1 receives a predetermined signal and resets an internal CPU. The reset detector 1 outputs a power on signal POWERON for instructing the CPU to start operating when reset is cleared. The reset detector 1 is connected to the power on reset terminal PONRST. The power on reset terminal PONRST inputs a power on reset signal for resetting an internal circuit. The reset detector 1 operates based on a clock input to a clock terminal CLK. The reset detector 1 of this embodiment includes a shift register and is used as a circuit for outputting a signal for setting to the test mode to the mode capture unit. Details of the reset detector 1 and mode capture unit are described later in detail.

The mode capture unit 2 stores a signal for specifying the test mode, where the signal is output from the reset detector 1. The mode capture unit 2 sets the test mode to a test circuit according to the stored data.

Figure 2:
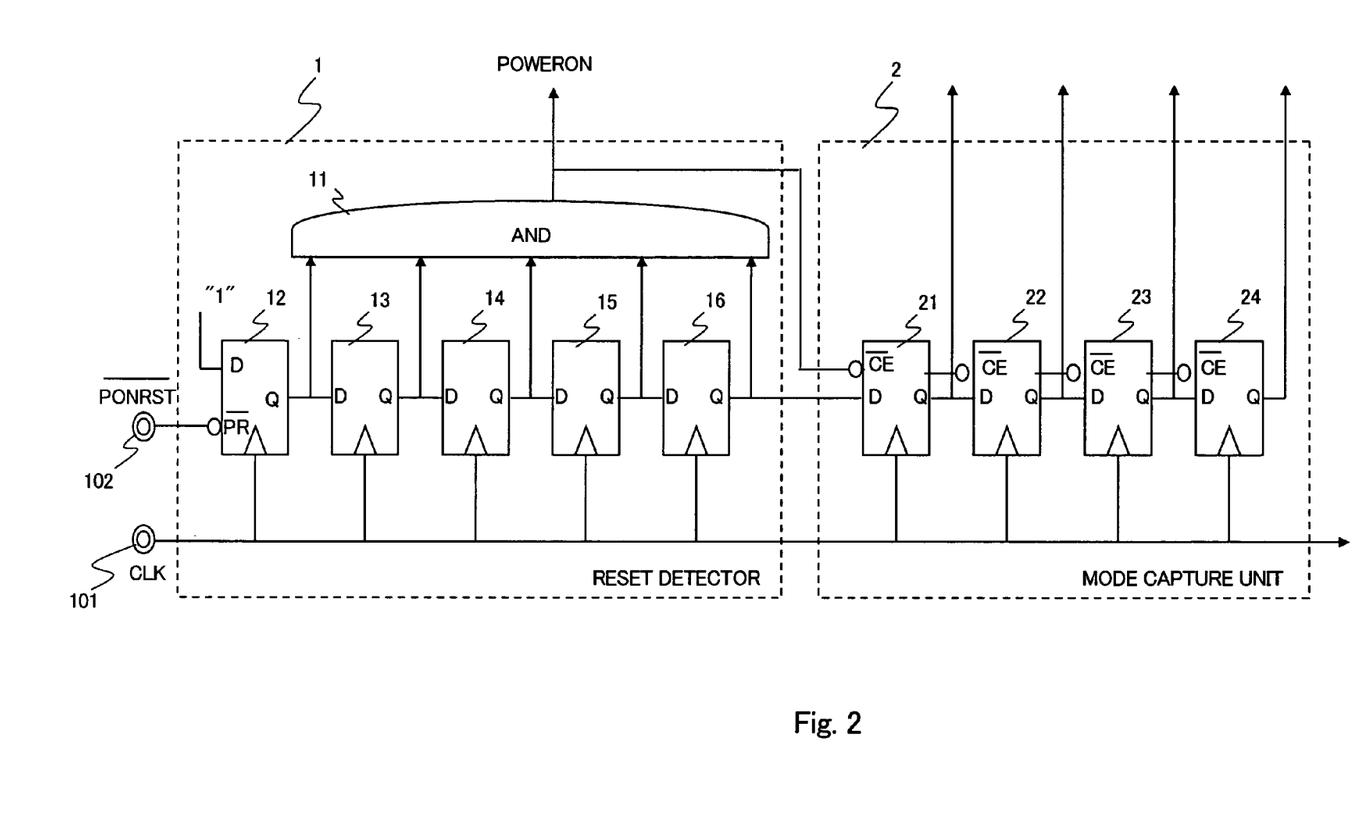
FIG. 2 is a configuration diagram showing the configuration of the semiconductor apparatus according to the first embodiment of the present invention.

The CPU 3 executes an arithmetic operation or various processes when the reset is cleared and the power on signal POWERON is input. The input/output buffer 4 is a buffer for inputting/outputting data via input/output terminals I/O 1 to I/O 8 while the semiconductor apparatus 100 is operating. The test circuit 5 is a circuit for executing a test according to the mode stored by the mode capture unit 2. The reset detector 1 and mode capture unit 2 are described hereinafter in detail. FIG. 2 is a detailed circuit diagram showing the reset detector 1 and mode capture unit 2.

As shown in FIG. 2, the reset detector 1 includes a power on signal output circuit 11 and a plurality of flip-flops (hereinafter referred to as FF) 12 to 16. In this embodiment, the power on output circuit 11 is constituted of an AND circuit for outputting a logical product. Further, the plurality of FFs 12 to 16 are connected in series. Among the FFs connected in series, the FF 12 corresponding to a first stage is a FF with reset function. In this embodiment, an input terminal of the FF 12 is always input with a constant logical value ("1" in this embodiment). The first stage FF inverts the logical value input to the input terminal according to an input to a terminal for controlling to reset the FF 12 before outputting it. In this embodiment, a terminal for inputting a power on reset signal is connected to the terminal for controlling to reset the first stage FF.

In this embodiment, the FF 12 is a D type FF with reset function while FFs 13 to 16 are D type FFs without reset function. Outputs from these FFs are respectively input to next stage FFs to constitute a shift register. Further, the outputs from these FFs are connected to an input of the AND circuit, which is the power on output circuit 11. Each FF operates according to a clock input to the clock input terminal CLK shown in FIG. 1. Note that an output from the power on output circuit 11 is input to the internal circuit and also to the mode capture unit.

As shown in FIG. 2, the mode capture unit 2 includes a plurality of FFs connected in series. The FFs constituting the mode capture unit each includes a capture enable terminal and are able to determine whether to take in a signal input to the input terminal of each FF according to a signal input to the capture enable terminal. In this embodiment, the mode capture unit 2 is a shift register constituted of 4 D type FFs 21 to 24. The FFs constituting the mode capture unit 2 operate according to a clock input to the clock input terminal CLK as with the reset detector 1.

The input terminal of the FF 21, which is the first stage of the mode capture unit 2, is connected to an output from the FF 16, which is the last stage of the reset detector 1. Further, a power on signal POWERON output from the power on output circuit 11 in the reset detector 1 is input to each of the capture enable terminals CE of the FFs 21 to 24. In this embodiment, a signal for setting test mode can be stored by the FFs 21 to 24 in the mode capture unit 2 having this capture enable function.

Figure 3:
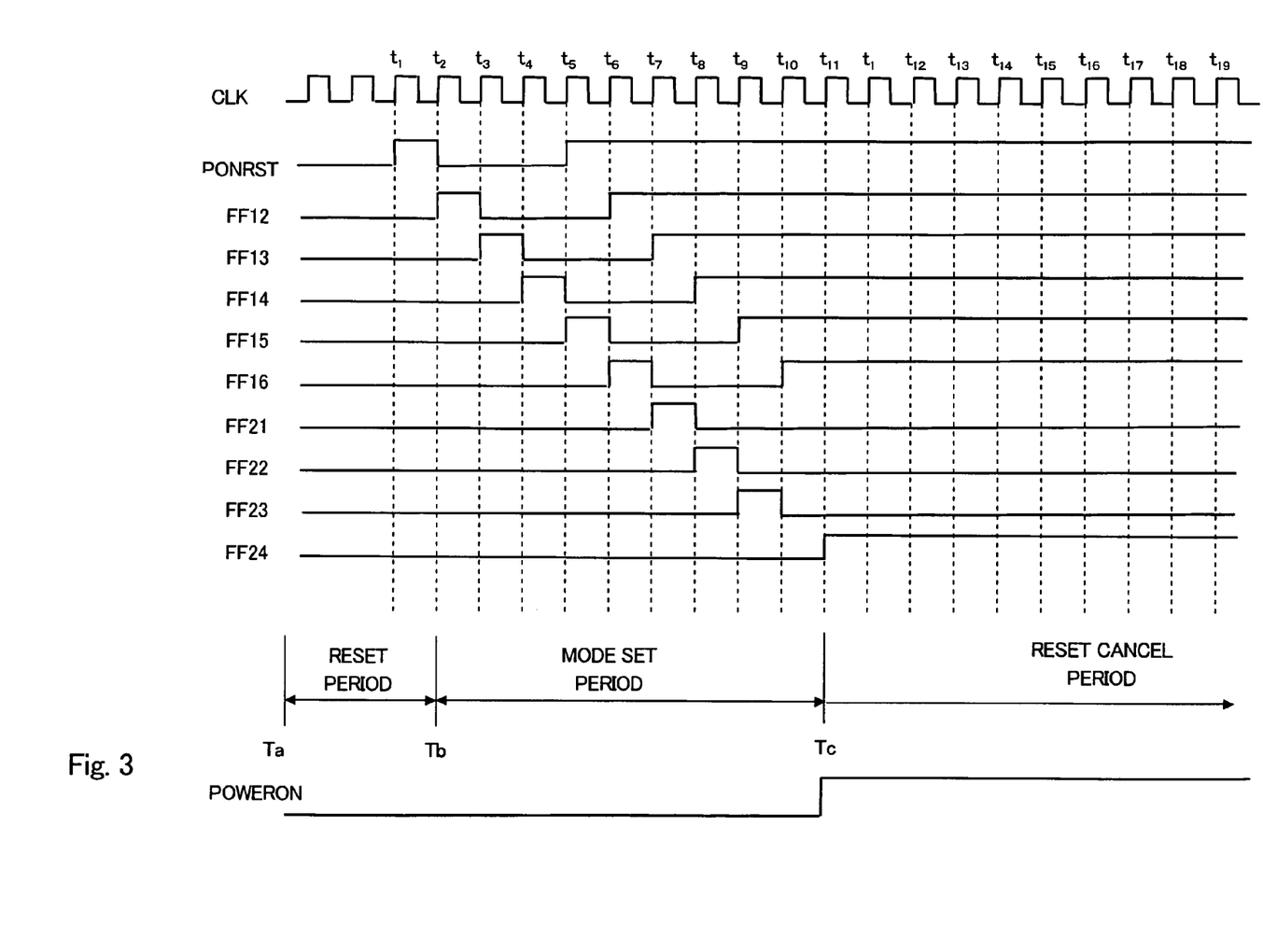
FIG. 3 is a timing chart showing an operation of the semiconductor apparatus according to the first embodiment of the present invention.

Specific operations of the reset operation, setting test mode and storing a signal for setting test mode are described hereinafter in detail using the reset detector 1 and mode capture unit 2 constituted as above with reference to the timing chart of FIG. 3. As shown in FIG. 3, a reset period (see time Ta to Tb), a mode setting period (see time Tb to Tc) and a reset clear period (see after time Tc) are set to the semiconductor apparatus of this embodiment. Hereinafter, operations in each period are described hereinafter in detail.

The reset period is a period for resetting an internal circuit (CPU etc.), the reset detector 1 and mode capture unit 2. During the reset period, a predetermined value (for example "0") is supplied to the power on reset signal terminal PONRST. During the reset period, as a predetermined power on reset signal is supplied, the first stage of the reset detector 1 which is FF 12 is always reset. Thus, the first stage FF 12 always continues to output "0", that is different from the constant logical value of the input terminal. Therefore, if the reset period continues for a certain period of time, outputs from all the FFs in the mode capture unit 2 are "0" as indicated by the time Ta of FIG. 3.

The mode setting period is a period for setting the mode capture unit 2 to test mode. In this embodiment, test mode is set by inputting a signal corresponding to the test mode into the power on reset terminal during the mode setting period. Hereinafter, an operation of the mode setting period is described with an example where the test mode setting signal is 4 bits, the FF 24 in FIG. 3 corresponds to a most significant bit and the FF 21 corresponds to a least significant bit.

Assuming that a test mode setting signal of 4 bits corresponding to "1000" is stored in the mode capture unit 2, a power on reset signal input is input to the power on reset terminal PONRST that becomes "H" level for 1 clock and then "L" level for 3 clocks for the clocks input to the clock input terminal (see time t1 to t5 in FIG. 3). Note that the power on reset terminal is always "H" level after inputting a signal corresponding to 4 bits to set a mode for 4 clocks. In response to inputting such reset signal to the power on reset terminal PONRST, the first stage FF 12 in the reset detector 12 outputs a signal described hereinafter.

At a rising edge of the second clock counted from the time t1 of FIG. 3 (see time t2 in FIG. 3), a fixed input "1" is output because the FF 12 is not reset. In the third clock counted from the time t1 (see time t3 in FIG. 3), "0" is output because the FF 12 is reset. Likewise, in the fourth and fifth clock counted from the time t1, "0" level signal is output. After that, based on a clock signal input to the clock input signal, the output is sequentially shifted to the FFs 13 to 16. The signal is shifted to the first stage FF 21 of the mode capture unit 2 at time t7 in FIG. 3, at a rising edge of a clock at time t10, the FF 24 in the mode capture unit stores "1" and the FFs 21 to 23 stores "0".

At this time as all of the FFs 12 to 16 of the reset detector output "1", the power on signal POWERON, which is the output from the power on output circuit 11, changes to "1". As the power on signal changes to "1", capture enable signals of the FFs 21 to 24 in the mode capture unit 2 change, each of the FFs 21 to 24 in the mode capture unit 2 do not take in the data of input terminal but transits to an operation to continue outputting the stored signal.

The reset clear period is a period that the internal circuit operates by outputting a reset clear signal to each unit of the internal circuit in response to an output of the power on signal POWERON. In the reset clear period, the internal circuit operates and a test according to the test mode stored by the mode capture unit 2.

As described in detail so far, in this embodiment, after a signal for resetting is input, a signal is input for setting test mode using the power on reset terminal until a reset clear signal is output to the internal circuit. The power on reset terminal is a terminal used until power supply is stably supplied. When the circuit starts operating, this terminal is used only for inputting a constant value. In this embodiment, a test mode setting signal can be supplied using the power on reset terminal. Further, after setting test mode, a reset clear signal can be immediately output to the internal circuit. By the power on reset terminal, terminals for setting test mode can be reduced.

In a conventional semiconductor apparatus, as a signal for setting test mode is input from an I/O terminal, a selector is connected to the I/O terminal. Due to the selector connected to the I/O terminal, AC characteristic of an input/output signal at a normal time can be deteriorated or delayed. In this embodiment, by using the power on reset terminal as an input of a test mode setting signal, the possibility of a deterioration of AC characteristic and a delay of the I/O terminal, which is an input/output terminal at a normal time, can be reduced.

Second Embodiment

Figure 4:
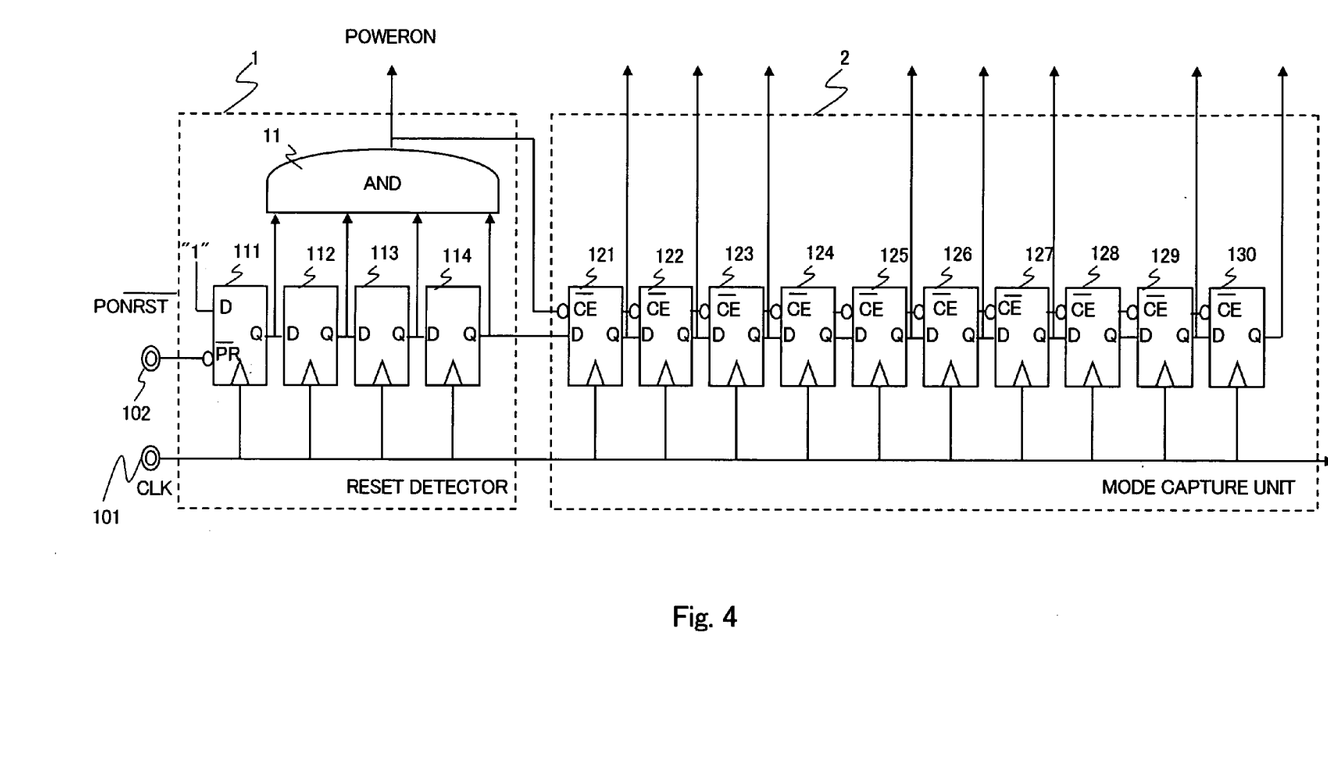
FIG. 4 is a configuration diagram showing the configuration of a semiconductor apparatus according to a second embodiment of the present invention.

FIG. 4 is a circuit diagram showing the configuration of a reset detector 1 and mode capture unit 2 according to a second embodiment of the present invention. Note that the components other than that are same as the semiconductor apparatus shown in FIG. 1, thus the explanation will not be repeated here. The reset detector 1 in this embodiment has almost same configuration as the reset detector 1 of FIG. 2 except that the number of FFs therein is different. Thus the explanation will not be repeated here. In this embodiment, the configuration of the mode capture unit 2 is different from the first embodiment. This embodiment is different from the first embodiment in that a dummy FF exists in the shift register constituted of FFs. The output of dummy FFs are not connected to the test circuit 5.

For example, assume that the reset detector 1 is constituted of four FFs and the mode capture unit 2 is also constituted of 4 FFs in the first embodiment. In such case, if a test mode signal is "111", a period exists in the power on reset terminal PONRST in which "H" level for 4 clocks in the mode setting period is. In this case, the power on output circuit 11 in the reset detector 1 may output a signal of "1" level before the mode capture unit 2 latches "1111" and setting test mode cannot be performed definitely.

Thus in this embodiment, by providing a dummy FF in the FFs of the mode capture unit 2 at a predetermined interval, test mode can certainly be set. The position to insert the dummy FF is determined according to the number of stages of the FFs constituting the reset detector 1. FIG. 4 is a view showing a case when the reset detector 1 is constituted of 4 FFs and the mode capture unit is constituted of 10 FFs, two of the FFs are dummy FFs.

In the mode capture unit 2 of FIG. 4, for data input in the mode setting period, one of the 4 consecutive FFs is a FF that does not output as a test mode setting signal. In FIG. 4, FF 124 and FF 128 are FFs not outputting test mode. With this arrangement, it is possible to set a mode of more than consecutive 4 bits even during the mode setting period.

As with the case of FIG. 3, the reset period (see time Ta to Tb of FIG. 5) and the reset clear period (see after time Tc of FIG. 5) are set to the semiconductor apparatus of this embodiment. Detailed explanation of the operations in these periods will not be repeated here as they are described in the first embodiment.

An operation of the mode setting period in this embodiment is described hereinafter in detail. In this embodiment, a case is described in which a test mode setting signal corresponds to 10 bits, FF 130 in FIG. 5 corresponds to a most significant bit and FF 121 corresponds to a least significant bit.

Figure 5:
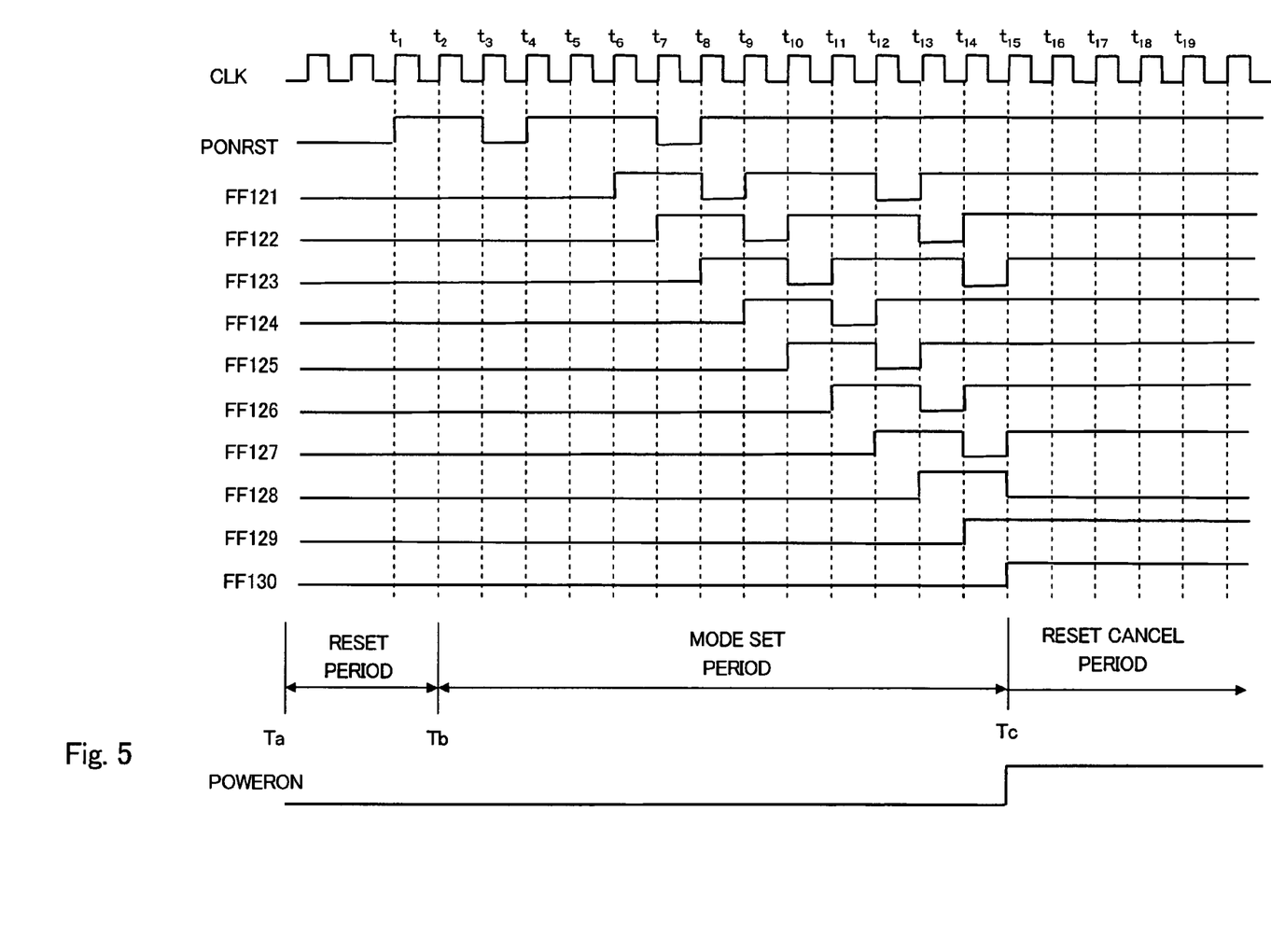
FIG. 5 is a timing chart showing an operation of the semiconductor apparatus according to the second embodiment of the present invention.

To output a test mode signal of 8 bits "11111111" to the test circuit, a test mode setting signal of 10 bits corresponding "1101110111" is stored to the mode capture unit 2 (see FIG. 5). To the power on reset terminal PONRST, a power on reset signal to have "H" level for 2 clocks, then sequentially "L" level for 2 clock, "H" level for 3 clocks, "L" level for 1 clock and "H" level for 3 clocks, for clocks input to the clock input terminal (see t1 to t11 in FIG. 5). Note that as with the first embodiment, the power on reset terminal is always "1" level after inputting a signal corresponding to 10 bits and setting mode for 10 clocks.

By inputting such reset signal to the power on reset terminal PONRST, at a rising edge of a clock at time t15 as with the first embodiment, FF 129 and FF 128 in the mode capture unit stores "1", FF 128 retains "0", FFs 125 to 127 retain "1", FF 124 retains "0" and FFs 121 to 123 retain "1". At this time, the FFs 124 and 128 are dummy FFs not outputting test mode. Further, when the power on signal changes to "1", each of the flip-flops in the mode capture unit 2 do not take in data of the input terminals but transits to an operation to continue outputting the stored signals. Specifically, a test mode signal of 8 consecutive bits "1" can be output to the test circuit.

As described in detail so far, the test mode can certainly be set by providing a dummy FF in the FFs of the mode capture unit 2 at any interval. Further, by providing the dummy FF, any value can be set to a test mode setting signal set to the mode capture unit. Further in this embodiment, an example is described in which 4 FFs for the reset detector and 10 FFs for the mode capture unit, however the number of FFs can be determined freely. The position to insert the dummy FFs is determined according to the number of stages of the FFs constituting the reset detector 1. In this embodiment, as the reset detector 1 is constituted of 4 FFs, at least one of the four consecutive FFs in the mode capture unit 2 needs to be inserted with a dummy FF. However, not limited to the embodiments, the position to insert the dummy FF and the number of dummy FF may be modified as appropriate according to the number of FF in the reset detector 1 and mode capture unit.

As described in the foregoing, the present invention enables to set test mode using the power on reset terminal. Further, after setting test mode, at the same time as outputting a reset clear signal to the internal circuit, the test mode signal can be output. Furthermore, by using the power on reset terminal, terminals for setting test mode can be reduced. Additionally, the I/O terminal far setting test mode is not required to be connected to the selector and by using the power on reset terminal directly for outputting the test mode setting signal, the possibility of a deterioration of AC characteristic and a delay of an input/output signal at a normal time can be reduced Although described in detail according to the embodiments of the present invention, it may be modified and changed without departing from the scope and spirit of the invention. For example in the present invention, a D type flip-flip with reset function is used for the first stage of the reset detector. However a logical gate such as an AND circuit for inputting a constant logical value may be used for on side. Further, a test mode setting signal may be a signal for determining test mode by decoding with the test circuit. To remove a circuit for decoding for example, each bit of the test mode setting signal corresponds to various tests and determining whether a test is required or not by "1" and "0" of each bit.

It is apparent that the present invention is not limited to the above embodiment but may be modified and changed without departing from the scope and spirit of the invention.

What is claimed is:

1. A semiconductor apparatus comprising:
    a reset terminal to input a reset control signal to reset an internal circuit;
    a reset detector to generate a reset clear signal to clear a reset of the internal circuit according to the input reset control signal; and
    a mode capture unit to store a test mode to test an operation of the internal circuit according to a signal input to the reset terminal.

2. The semiconductor apparatus according to claim 1, wherein
    the reset detector includes a first shift register to shift an input bit input to the reset terminal to output, and
    the mode capture unit includes a second shift register to shift the input bit output by the reset detector to store the test mode.

3. The semiconductor apparatus according to claim 2, wherein the second shift register controls a shift operation according to the reset clear signal output by the reset detector.

4. The semiconductor apparatus according to claim 2, wherein the second shift register includes a plurality of flip-flops and among the plurality of flip-flops, a predetermined number of flip-flops retain the test mode.

5. The semiconductor apparatus according to claim 3, wherein the second shift register includes a plurality of flip-flops and among the plurality of flip-flops, a predetermined number of flip-flops retain the test mode.

6. The semiconductor apparatus according to claim 1, wherein a test is executed according to a signal for setting the test mode output by the mode capture unit.

7. The semiconductor apparatus according to claim 2, wherein a test is executed according to a signal for setting the test mode output by the mode capture unit.

8. A method to execute a test in a semiconductor apparatus to execute a test corresponding to a test mode specified, the method comprising:
    resetting an internal circuit of a semiconductor apparatus by a reset signal input to the reset terminal;
    changing the signal input to the reset terminal to set the test mode; and
    executing a test corresponding to the test mode set by the setting according to the reset clear signal input to the reset terminal.

* * * * *